United States Patent
Wei et al.

(10) Patent No.: US 10,224,694 B2
(45) Date of Patent: Mar. 5, 2019

(54) METHOD AND APPARATUS FOR COHERENCE ENHANCEMENT OF SWEEP VELOCITY LOCKED LASERS VIA ALL-ELECTRONIC UPCONVERSION

(71) Applicant: Rhode Island Board of Education, State of Rhode Island and Providence Plantations, Providence, RI (US)

(72) Inventors: Tao Wei, West Kingston, RI (US); Zhen Chen, Kingstown, RI (US); Gerald Hefferman, Warwick, RI (US)

(73) Assignee: Rhode Island Board of Education, State of Rhode Island and Providence Plantations, Providence, RI (US)

(*) Notice: Subject to any disclaimer, the term of this patent is extended or adjusted under 35 U.S.C. 154(b) by 31 days.

(21) Appl. No.: 15/656,255

(22) Filed: Jul. 21, 2017

(65) Prior Publication Data

US 2019/0027897 A1    Jan. 24, 2019

(51) Int. Cl.
| H01S 5/042 | (2006.01) |
| H01S 5/062 | (2006.01) |
| H01S 5/068 | (2006.01) |
| H01S 5/0683 | (2006.01) |

(52) U.S. Cl.
CPC ...... H01S 5/06223 (2013.01); H01S 5/06817 (2013.01); H01S 5/06821 (2013.01); H01S 5/06835 (2013.01); H01S 5/042 (2013.01)

(58) Field of Classification Search
CPC .. H01S 5/06223; H01S 5/062–5/06258; H01S 5/068–5/0687
See application file for complete search history.

(56) References Cited

U.S. PATENT DOCUMENTS

| 4,907,237 A | * | 3/1990 | Dahnnani | H01S 5/14 372/18 |
| 9,841,301 B2 | * | 12/2017 | Wei | G01H 9/004 |
| 9,958,605 B2 | * | 5/2018 | Wei | G02B 6/0208 |
| 2010/0085992 A1 | * | 4/2010 | Rakuljic | G01D 5/266 372/20 |
| 2016/0254646 A1 | * | 9/2016 | Li | H01S 3/0627 372/32 |

\* cited by examiner

*Primary Examiner* — Xinning (Tom) Niu
*Assistant Examiner* — Sean P Hagan
(74) *Attorney, Agent, or Firm* — Barlow, Josephs & Holmes, Ltd.

(57) ABSTRACT

The present disclosure provides methods and apparatus to improve the dynamic coherent length of a sweep velocity-locked laser pulse generator (SV-LLPG) in an all-electronic fashion. A digital SV-LLPG is disclosed with two operation modes, i.e., unidirectional and bidirectional sweep modes; self-adaptive and time-dependent loop parameters (gain and location of poles/zeros); and, self-adaptive initial input curve. High frequency locking architectures, both single-side band (SSB) modulation method and direct phase measurement method, are provided to suppress the linewidth, or improve the coherent length, of the swept laser. A combination of high and low frequency locking, or a combination of multiple architectures disclosed in this invention, is utilized to achieve a higher level of linewidth reduction. The enhanced laser coherence extends the measurement range by at least one order of magnitude for applications including frequency-modulated continuous wave (FMCW) light detection and ranging (LiDAR) and optical fiber distributed sensing applications.

15 Claims, 10 Drawing Sheets

METHOD AND APPARATUS FOR COHERENCE ENHANCEMENT OF SWEEP VELOCITY LOCKED LASERS VIA ALL-ELECTRONIC UPCONVERSION

STATEMENT OF GOVERNMENT INTEREST

The present invention was made with government support under Grant Nos. CCF1439011, CMMI1462656 and EAR1442623, all awarded by the National Science Foundation. The government has certain rights in the invention.

BACKGROUND OF THE INVENTION

Field of the Invention

The instant invention relates to methods and apparatus to improve the dynamic coherent length of a sweep velocity-locked laser pulse generator in an all-electronic fashion. The enhanced laser coherence, or coherent length, can extend the measurement range for applications including frequency-modulated continuous wave (FMCW) light detection and ranging (LiDAR) and optical fiber distributed sensing applications.

Description of Related Art

At the core of both FMCW LiDAR and OFDR distributed sensing technology is a coherent optical source, or laser, that can output linearly swept frequency as a function of time. Currently, one cost-effective solution to achieve a frequency-swept laser is through modulating the injection current of the semiconductor laser. However, the corresponding frequency sweep is not sufficiently linear as a function of time, resulting in distorted measurements in the Fourier Transform domain. Previously, a frequency/wavelength calibration method comprising the introduction of an interferometer with a long and fixed delay line was used to correct the non-linearity of swept-laser source. However, this method required the use of a very long delay line, resulting in high vibrational noise and a bulky design. Another solution was through the use of an optical phase locked loop (OPLL) architecture to lock the sweep velocity to a stable reference source within the entire length of laser pulse duration.

However, there remains a critical issue, which is the broad linewidth of the semiconductor lasers. For example, the distributed feedback lasers (DFB) typically hold a linewidth of around a few MHz, resulting in a maximum measurement range of only a few tens of meters for both FMCW LiDAR and OFDR distributed sensing applications. Cost-effective semiconductor lasers, such vertical emitting cavity surface laser (VECSEL), have broader linewidth and shorter measurement range. In order to reduce the linewidth, or improve the coherent length, of the swept semiconductor lasers, an acoustic optical modulator (AOM) was employed in a servo-loop to dynamically mitigate the optical phase noise at the output of the semiconductor laser, mitigating the phase noise of semiconductor laser with a high control loop bandwidth, and resulting in a much narrower linewidth. However, the use of AOM is associated with a high driving voltage, high-cost, and bulky design.

SUMMARY OF THE INVENTION

The present disclosure provides a series of all-electronic architectures, that are capable of significantly improving (>10 times) the coherent length, or reducing the linewidth, of sweep velocity-locked semiconductor lasers without the use of any mechanically movable structure, such as AOM. The architectures can be implemented on field-programmable gated array (FPGA) or application-specific integrated circuit (ASIC) within a small footprint.

BRIEF DESCRIPTION OF THE DRAWINGS

While the specification concludes with claims particularly pointing out and distinctly claiming particular embodiments of the instant invention, various embodiments of the invention can be more readily understood and appreciated from the following descriptions of various embodiments of the invention when read in conjunction with the accompanying drawings in which:

DETAILED DESCRIPTION OF THE INVENTION

Figure 1:
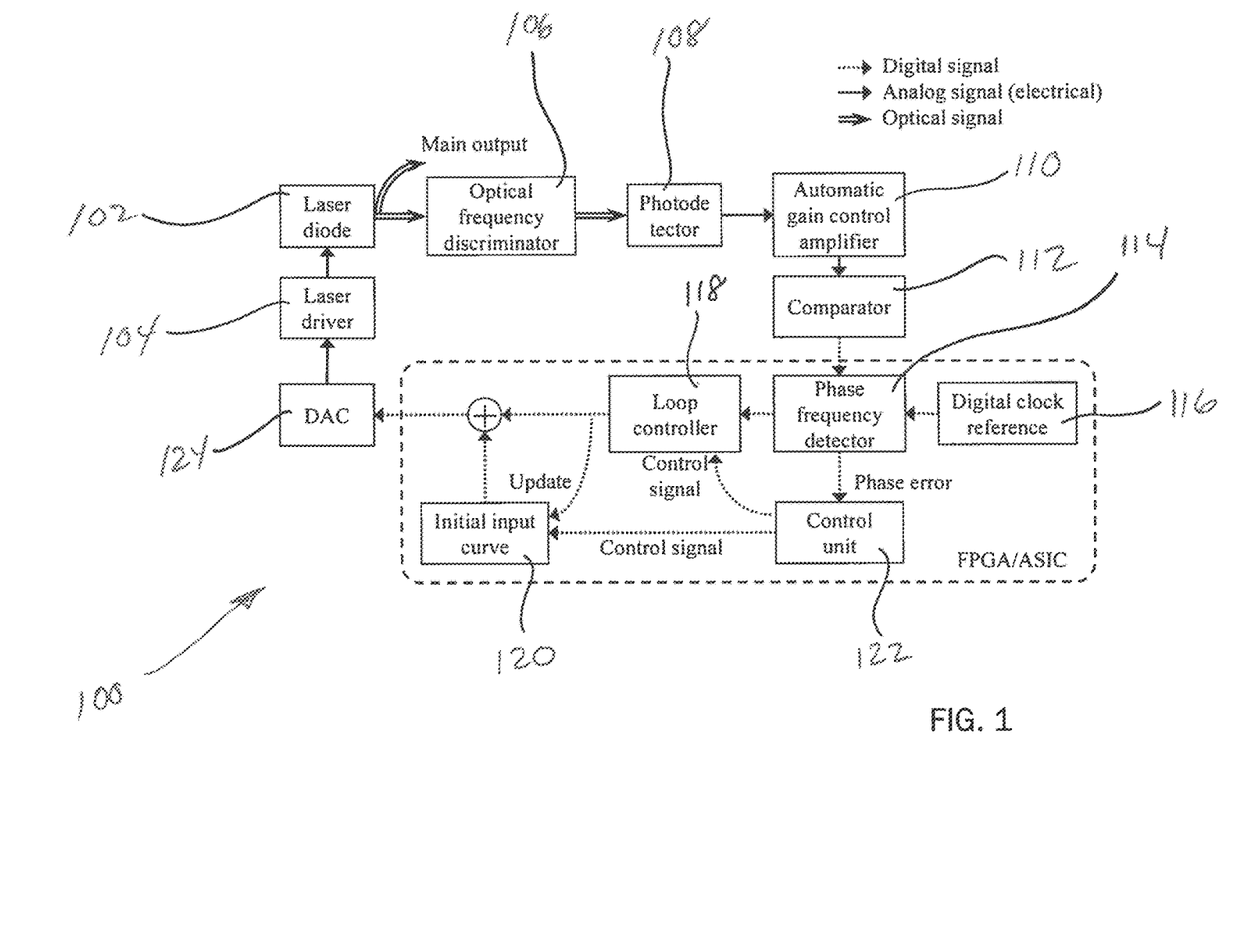
FIG. 1 is the exemplary architecture of digital sweep velocity-locked laser pulse generator (SV-LLPG)

Referring now to the drawings, FIG. 1 illustrates an exemplary architecture of a digital sweep velocity-locked laser pulse generator generally indicated at 100. A semiconductor laser diode 102, driven by a voltage-to-current driver 104, outputs a chirped laser pulse. The chirped pulse is sent into an optical frequency discriminator 106 to translate the frequency changing rate of the chirped input into a radio frequency (RF) signal and captured by a photodetector 108. This OFD device 106 is typically an optical interferometer or resonator with a fixed delay line, such as a Mach-Zehnder interferometer, Michelson interferometer, fiber ring resonator, etc. The frequency of this RF signal is linearly proportional to the sweep velocity of the chirped laser output. The RF signal is amplified through a transimpedance automatic gain control amplifier (AGC) 110 to compensate for the amplitude modulation associated with the chirped pulse. The AGC output, ideally with constant amplitude over time, is converted to a digital signal train, using a voltage comparator 112 with certain preset threshold voltage. A phase frequency detector (PFD) 114 is used to compare the phase between the digital signal produced by optical signal and a high precision digital clock reference signal 116. The phase error is fed into a loop controller 118, also known as loop filter. The summation of the control signal out of the loop controller 118 and an initial input curve unit 120 is fed into a digital-to-analog converter (DAC) 124 to generate driving voltage to drive the laser driver 104. A basic control loop is now formed to lock the sweep velocity of the chirped laser 102.

The majority of the control loop system, including digital clock reference 116, PFD 114, loop controller 118, and initial input curve unit 120, can be all integrated in a digital chip (represented within dashed line). This chip can be a field programmable gated array (FPGA) or an application specific integrated circuit (ASIC). A control unit 122 can be built inside this digital chip to achieve three functions stated below:

(a) The initial input curve is self-adaptive. It can be modified by directly adding the values of control signal from the loop controller 118 to the initial input curve, which is saved in a memory module (not shown) in the chip. Two to three iterations are typically enough to find the sufficiently effective initial input curve, using this method.

Figure 2A:
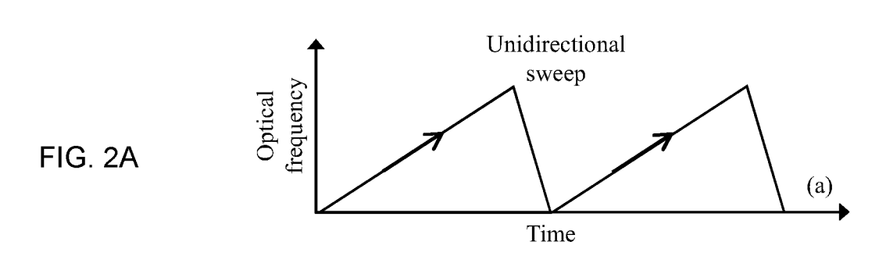
FIG. 2a is the optical frequency change as a function of time at the output of the SV-LLPG in unidirectional sweep mode.
Figure 2B:
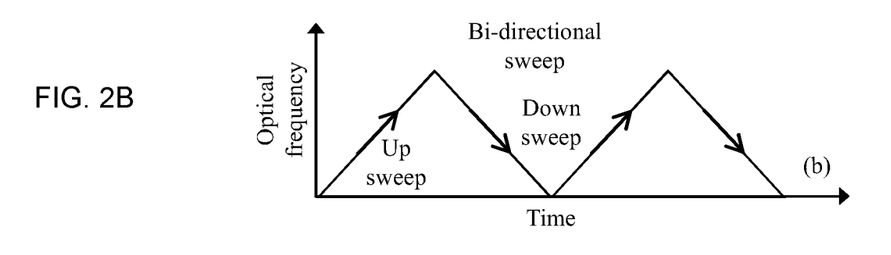
FIG. 2b is the optical frequency change as a function of time at the output of the SV-LLPG in bidirectional sweep mode.

(b) FIG. 2a and FIG. 2b depict optical frequency change as a function of time at the output of the SV-LLPG in unidirectional sweep mode and bi-directional mode, respectively. Unidirectional sweep mode only controls a single-sided chirp, i.e., either up sweep or down sweep, while bi-directional mode controls double-sided chirp, which is achieved by changing the sign of the loop controller output. These two modes are switched by the control unit, which is determined by user.

Figure 3:
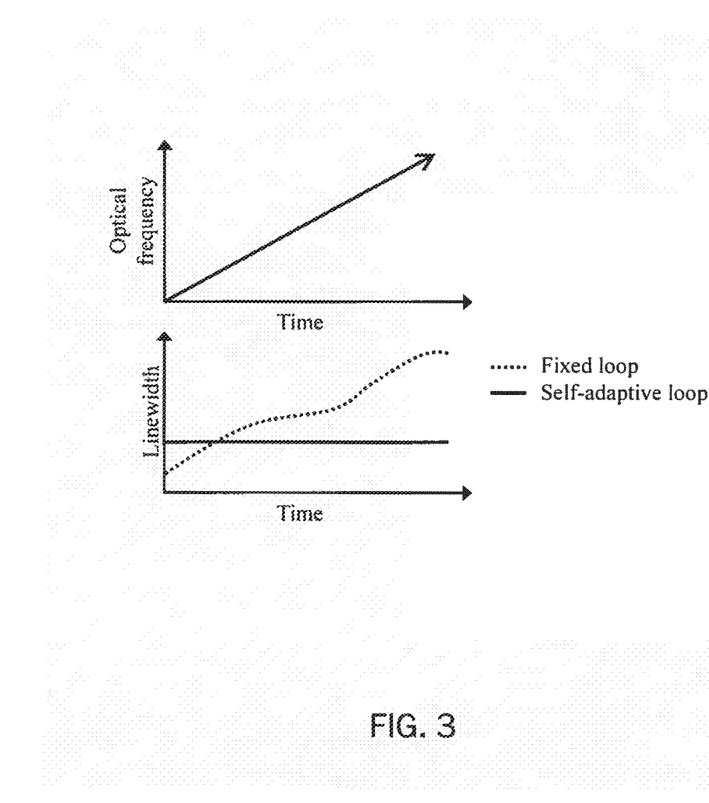
FIG. 3 is the linewidth change as a function of time during one-sided sweep using conventional fixed loop in comparison with using self-adaptive and time-dependent loop parameters.

(c) The loop parameters, such the loop bandwidth, gain, and the location of the poles/zeroes, are time-dependent and self-adaptive. The control unit 122 collects the phase error as a function of time in real-time from the PFD 114. The phase noise information is used to generate optimized loop parameters. The control unit 122 is programmed to analyze the time-dependent phase noise, find the optimized loop parameters, and update the loop controller 118, accordingly. It is worth noting that all the loop parameters are time-dependent, meaning that they can change their values within a single chirp, to optimize the performance of the SV-LLPG in terms of phase noise, or linearity/linewidth. Shown in FIG. 3, the self-adaptive and time-dependent loop holds the advantage to optimize the sweep velocity lock within the entire duration of a chirped pulse.

Figure 4:
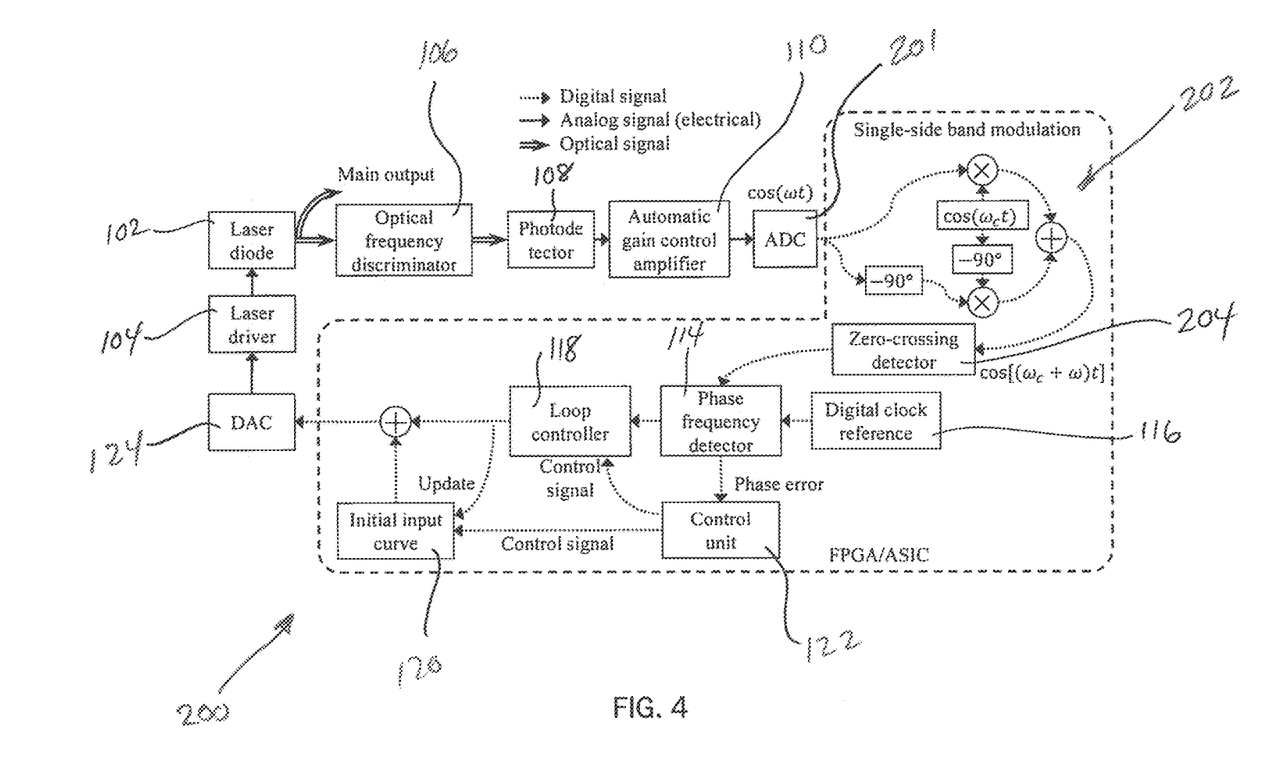
FIG. 4 is an exemplary architecture of SV-LLPG with improved coherent length via signal-side band (SSB) modulation method.

FIG. 4 depicts an exemplary architecture of an SV-LLPG generally indicated at 200 with improved coherent length via signal-side band (SSB) modulation method. The general configuration is similar to embodiment 100 with similar components with the exception of an Analog to Digital Converter (ADC) 201 at the output of the AGC 110. The key to improving coherence, or reducing linewidth of the laser output, is to mitigate the phase noise at broader bandwidth. To do so, the loop bandwidth needs to be broadened. However, in the previous design, shown in FIG. 1, the loop bandwidth is limited by the bandwidth of the RF signal, which is typically ranging from a few tens of kHz to a few MHz.

In order to break this limit, a Single-Sideband (SBB) modulation module 202 is used to up-convert the RF signal from $\omega$ to $\omega+W_c$, where $\omega_c$ is the carrier frequency, which is at least 10 times higher than the RF signal frequency, $\omega$. The up-converted signal is fed into a zero-crossing detector 204 to produce a high-speed digital signal. Thus, the loop bandwidth of this architecture can be much broader than the RF signal frequency, $\omega$. The entire SSB modulation function can be built and integrated in the digital chip, shown in FIG. 4. Also, it is worth noting that the SSB modulation can be achieved using standard analog circuit as well.

Figure 5:
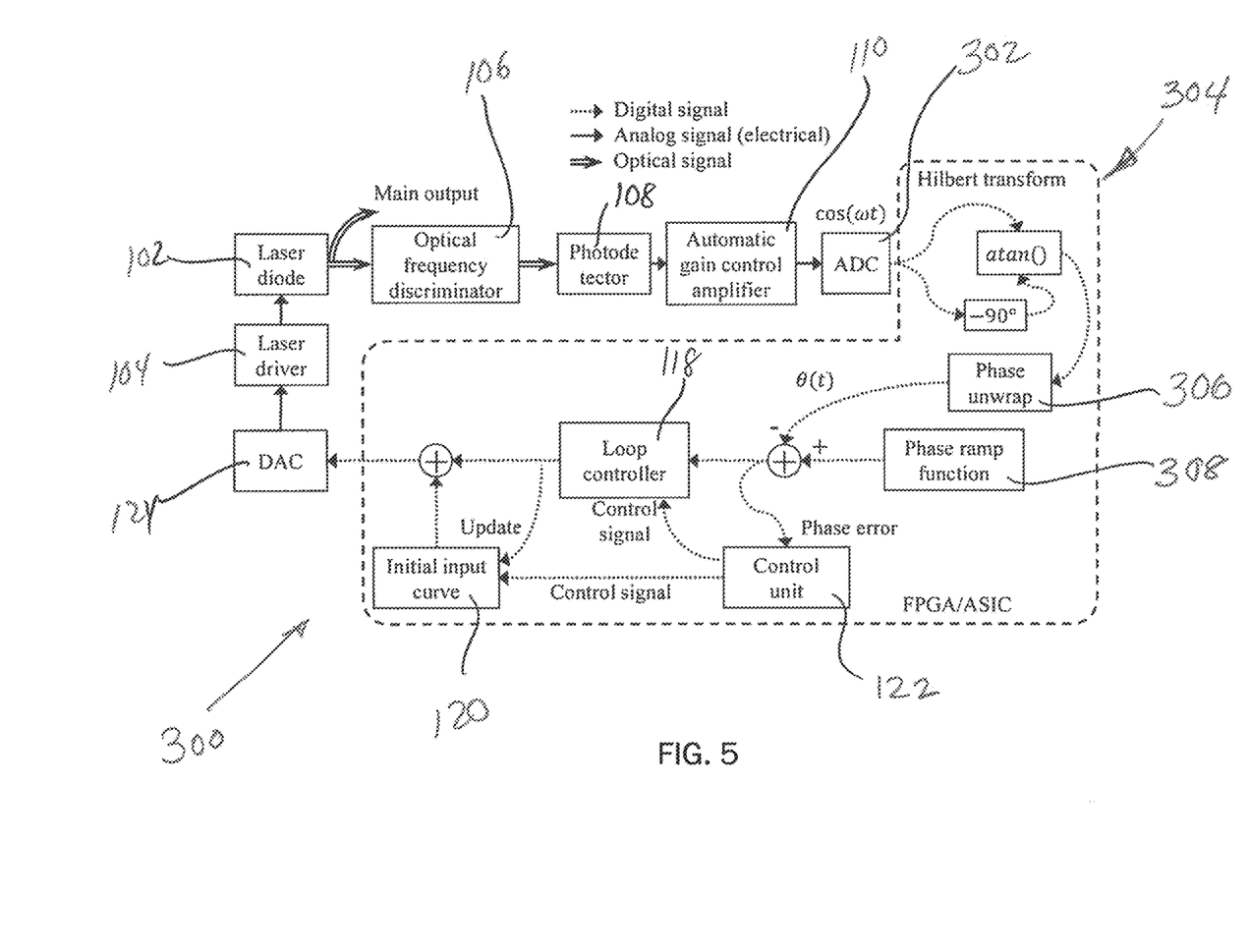
FIG. 5 is an exemplary architecture of SV-LLPG with improved coherent length via direct phase measurement (DPM) method.

FIG. 5 is an exemplary architecture of SV-LLPG generally indicated at 300 with improved coherent length via a direct phase measurement (DPM) method. The general configuration is similar to embodiment 200 with similar components. The essence of this method is also increasing the loop bandwidth of the SV-LLPG. The RF signal, captured by an analog-to-digital converter (ADC) 302, is Hilbert transformed 304 to output instantaneous phase as a function of time. The unwrapped phase 306 is locked to a linear progressive phase ramp function 308, or the reference signal (not shown), to achieve sweep velocity locking. The phase measurement sampling rate is the same as the master clock of the digital chip, which can easily reach 100 MHz. Thus, the loop bandwidth of this method is significantly larger than previously description SV-LLPG in FIG. 1.

Figure 6:
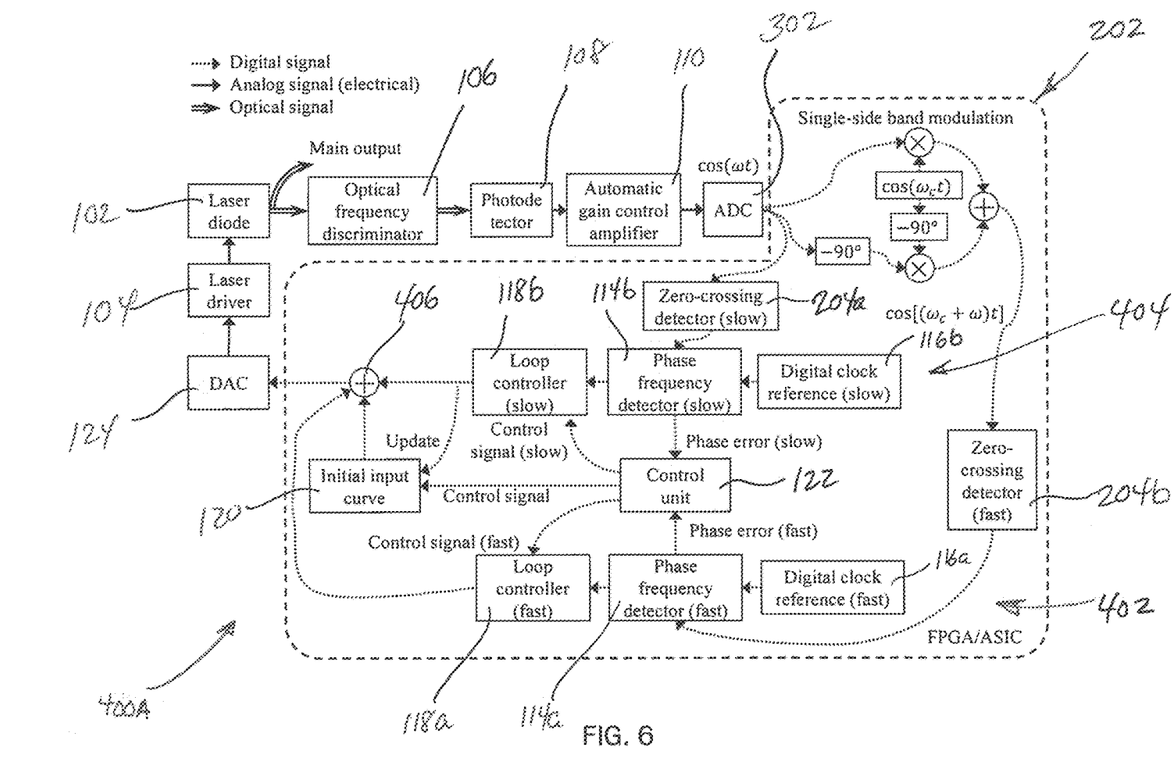
FIG. 6 is an exemplary architecture of SV-LLPG with improved coherent length via multiple loop locking method with digital loop combination (SSB modulation as fast loop)
Figure 7:
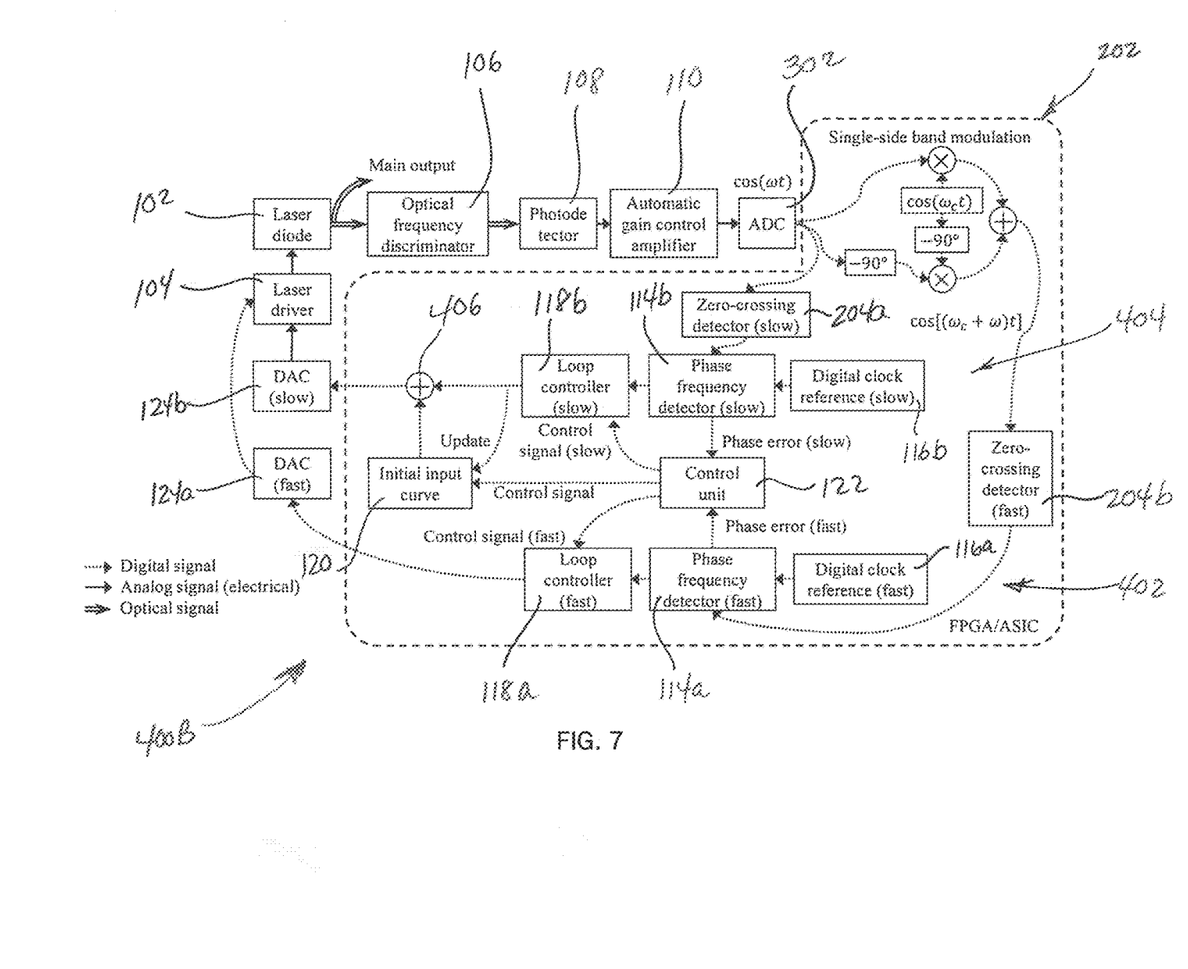
FIG. 7 is an exemplary architecture of SV-LLPG with improved coherent length via multiple loop locking method with analog loop combination (SSB modulation as fast loop)

FIG. 6 is an exemplary architecture of SV-LLPG generally indicated at 400 with improved coherent length via multiple loop locking method (SSB modulation 202 as fast loop). The general configuration is similar to embodiment 200 with similar components. This approach holds the advantage of simultaneously providing fast and slow servo control loops 402 and 404 to maximize the locking performance at both low frequency range and high frequency range. It is worth noting that the control loop signals from both the fast loop 402 and the slow loop 404 can be added together via a digital summator 406, shown in FIG. 6, or in an analog adder (not shown), or bias Tee (not shown), built in the laser driver 104, shown in FIG. 7. In the bias Tee configuration, there is a separate DAC 124 for each of the fast control loop 402 and the slow control loop 404.

Figure 8:
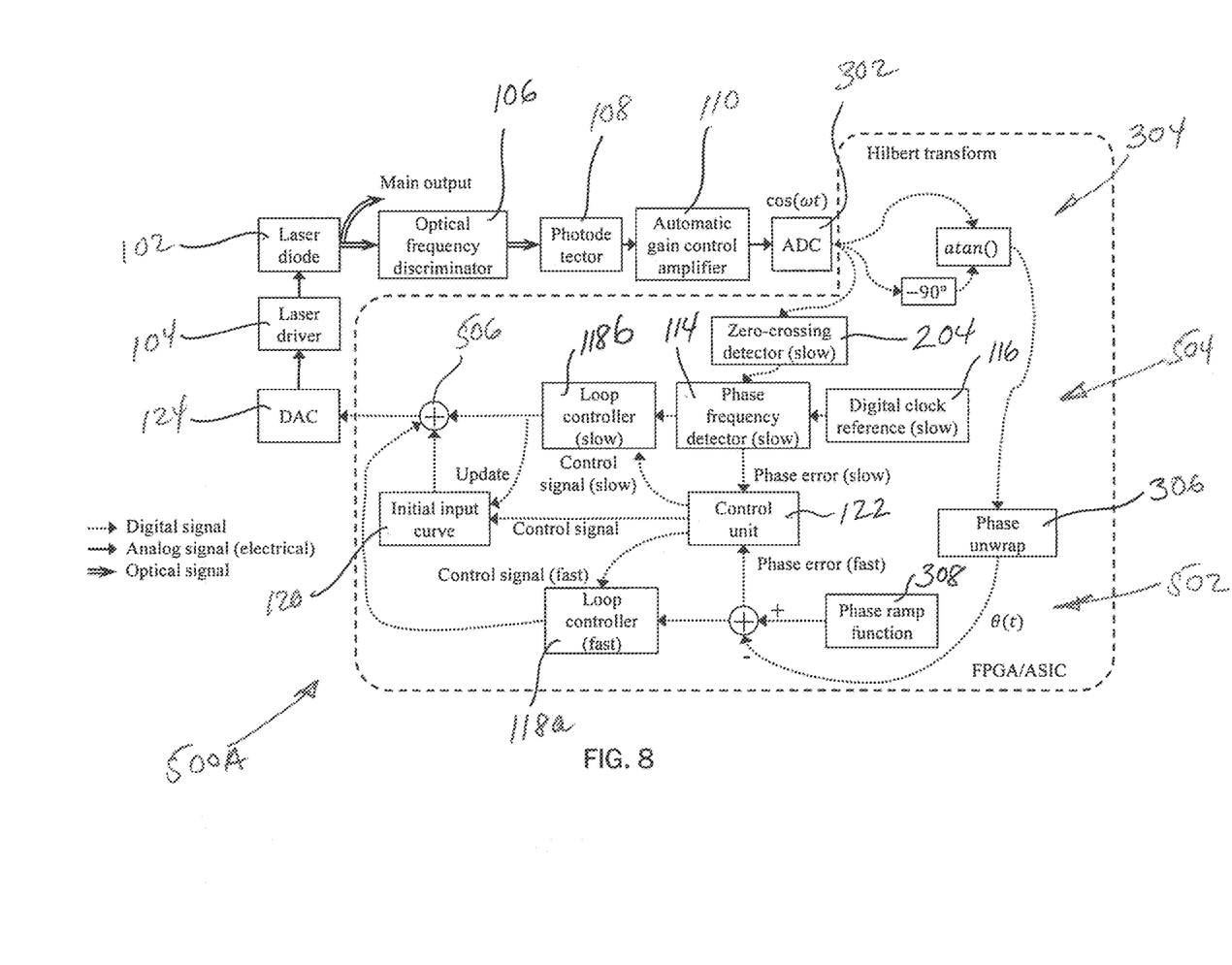
FIG. 8 is an exemplary architecture of SV-LLPG with improved coherent length via multiple loop locking method (DPM as fast loop) with digital loop combination.
Figure 9:
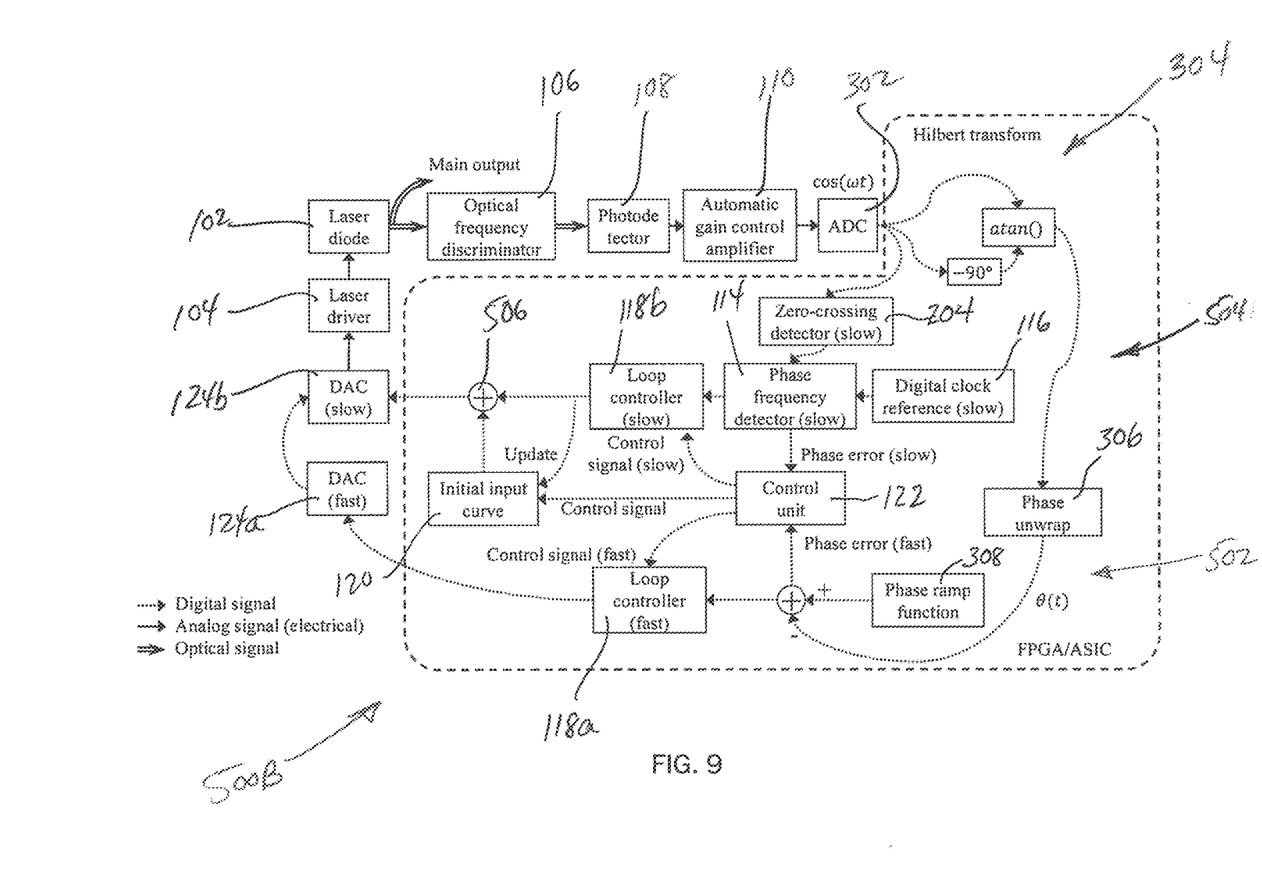
FIG. 9 is an exemplary architecture of SV-LLPG with improved coherent length via multiple loop locking method (DPM as fast loop) with analog loop combination.

FIG. 8 is an exemplary architecture of SV-LLPG generally indicated at 500 with improved coherent length via multiple loop locking method (DPM as fast loop). The general configuration is similar to embodiment 300 with similar components. This approach holds the advantage of simultaneously providing fast and slow servo control loops 502 and 504 to maximize the locking performance at both low frequency range and high frequency range. It is worth noting that the control loop signals from both fast loop 502 and slow loop 504 can be added together via a digital summator 506, shown in FIG. 8, or in an analog adder (not shown), or bias Tee 508, built in the laser driver 104, shown in FIG. 9. In the bias Tee configuration, there is a separate DAC 124 for each of the fast control loop 502 and the slow control loop 504.

It is worth noting that the number of loops in disclosed multi-loop architecture is not limited to two. Also, a series of combination of SSB modulation and DPM methods can be integrated to form multiple control loops.

Figure 10:
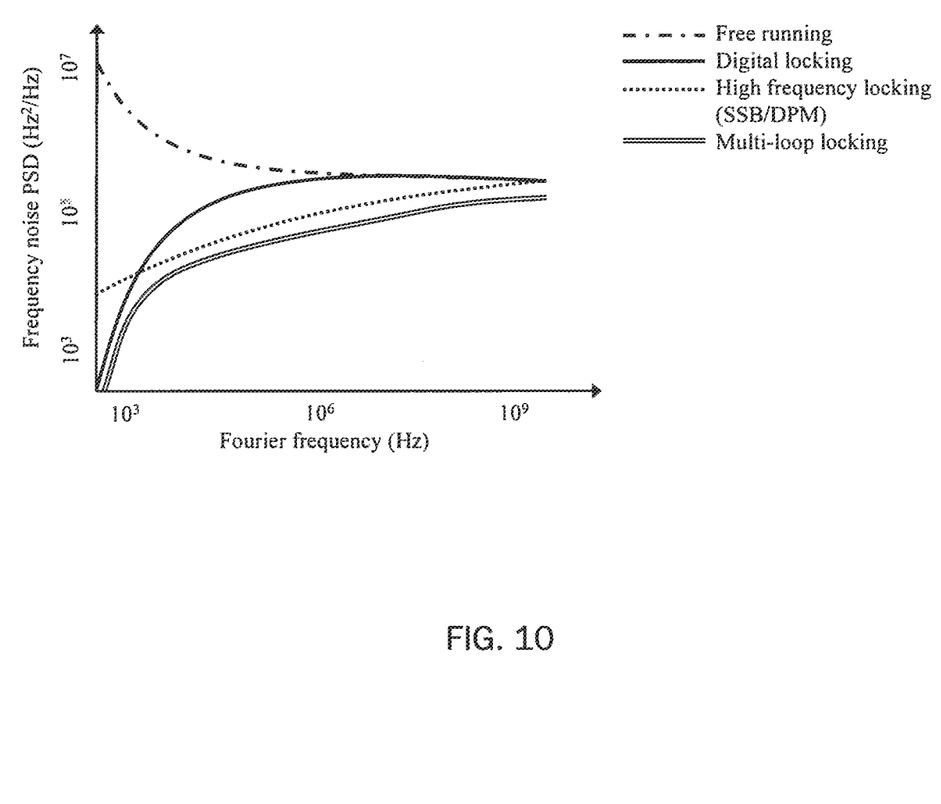
FIG. 10 is a comparison of the power spectrum density (PSD) of frequency noise of the chirped laser pulse using different methods, including free-running (open loop), digital SV-LLPG with self-adaptive loop parameters and self-adaptive initial input curve (FIG. 1), high frequency SV-LLPG (both SSB modulation method in FIG. 4 and DPM method in FIG. 5), and multi-loop architectures (FIG. 6-9).

FIG. 10 shows the power spectrum density (PSD) of frequency noise of the chirped laser pulse using different methods. Under free running operation mode, in which the control loop is open, the PSD of frequency noise is high, forming a Lorentz distribution. Under digital locking mode, described in FIG. 1, the low frequency portion of the PSD of frequency noise is suppressed, and the high frequency portion is left unchanged. Under high frequency locking operation, including both SSB modulation method in FIG. 4 and DPM method in FIG. 5, both low frequency and high frequency portions of the frequency noise PSD are suppressed simultaneously, leading to a much-reduced linewidth. Under multiple-loop operation, including both SSB type double loop in FIG. 6 and FIG. 7, and DPM type double loop in FIG. 8 and FIG. 9, both low frequency and high frequency portions are significantly suppressed, giving the best performance out of all disclosed architectures.

It can therefore be seen that the exemplary embodiments provide a set of unique and novel advancements, which have substantial potential as a series of low-cost and high-performance. architectures to substantially reduce the linewidth of SV-LLPG in a purely electronic way. This invention will directly benefit applications, such as FMCW LiDAR and OFDR distributed fiber optic sensing applications, by significantly extending their measurement ranging at a minimum cost.

While there is shown and described herein certain specific structures embodying various embodiments of the invention, it will be manifest to those skilled in the art that various modifications and rearrangements of the parts may be made without departing from the spirit and scope of the underlying inventive concept, and that the same is not limited to the particular forms herein shown and described except insofar as indicated by the scope of the appended claims.

What is claimed is:

1. A sweep velocity-locked laser pulse generator, comprising:
    a laser;
    a laser driver circuit operating the laser at a constant sweep velocity;
    a coupler splitting output of the laser into a sensing portion and a control portion;
    an optical frequency discriminator having a fixed delay and outputting an analog RF signal, linearly proportional to the sweep velocity;
    a photodiode (PD) receiving output from the optical frequency discriminator;
    an automatic gain control (AGC) amplifier operative to adjust the amplitude of the RF signal;
    an analog to digital converter (ADC) receiving output from said AGC and converting said output into digital signals;
    a Digital Reference Clock;
    a digital phase frequency detector (PFD) receiving said digital signals from said AGC and from said Digital Reference Clock, and generating a digital phase error signal;
    a loop controller receiving said digital phase error signal and generating a time varying laser control signal provided to said laser driver circuit;
    a control unit to acquire and analyze instantaneous phase noise from PFD, and generate self-adaptive and time-dependent loop parameters to update the digital loop controller; and
    a self-adaptive initial input curve unit to provide an initial voltage,
    wherein the laser is modulated by the time varying signal through the laser driver to produce a sweep velocity-locked laser pulse.

2. The sweep velocity-locked laser pulse generator of claim 1, wherein the optical frequency discriminator comprises either an interferometer or a resonator.

3. The sweep velocity-locked laser pulse generator of claim 1 wherein the time-dependent loop parameters comprise gain and the location of poles/zeros.

4. The sweep velocity-locked laser pulse generator of claim 3 wherein the time-dependent loop parameters are self-adaptive.

5. The sweep velocity-locked laser pulse generator of claim 1 wherein the self-adaptive initial input curve unit self-adjust through phase loop iterations as demanded by the control unit.

6. The sweep velocity-locked laser pulse generator of claim 1 wherein the control unit selectively controls operation in either a unidirectional sweep mode or a bi-directional sweep mode.

7. The sweep velocity-locked laser pulse generator of claim 1 wherein said ADC comprises a voltage comparator.

8. The sweep velocity-locked pulse generator of claim 1 further comprising a single side-band module receiving output from the ADC and upconverting the RF signal $\omega$, from $\omega$ to $\omega+\omega c$, where $\omega c$ is the carrier frequency, which is at least 10 times higher than the RF signal frequency, $\omega$, said up-converted signal being fed into a zero-crossing detector to produce a high-speed digital signal.

9. The sweep velocity-locked pulse generator of claim 1 further comprising a Hilbert transformation module receiving output from the ADC and outputting an instantaneous unwrapped phase as a function of time, said unwrapped phase being locked to a linear progressive phase function, or to the reference signal to provide sweep velocity locking.

10. The sweep velocity-locked pulse generator of claim 8 further comprising parallel fast and slow zero crossing detectors receiving said up-converted signal and parallel fast and slow servo control loops.

11. The sweep velocity locked pulse generator of claim 10 wherein the control signals from the fast control loop and the slow control loop are added together via a digital summator.

12. The sweep velocity locked pulse generator of claim 10 wherein the control signals from the fast control loop and the slow control loop are added together via a bias Tee provided in the laser driver circuit.

13. The sweep velocity-locked pulse generator of claim 1 further comprising
    a fast control loop comprising a Hilbert transformation module receiving output from the ADC and outputting an instantaneous unwrapped phase as a function of time, said unwrapped phase being locked to a linear progressive phase function, or to the reference signal to provide sweep velocity locking, and
    a slow control loop comprising a zero crossing detector and a servo control loop.

14. The sweep velocity locked pulse generator of claim 13 wherein the control signals from the fast control loop and the slow control loop are added together via a digital summator.

15. The sweep velocity locked pulse generator of claim 13 wherein the control signals from the fast control loop and the slow control loop are added together via a bias Tee provided in the laser driver circuit.

* * * * *